US008957748B2

(12) United States Patent
Tomimbang

(10) Patent No.: US 8,957,748 B2
(45) Date of Patent: Feb. 17, 2015

(54) SOLENOID-ACTUATED CONTACTOR

(71) Applicant: Wendell E. Tomimbang, Kissimmee, FL (US)

(72) Inventor: Wendell E. Tomimbang, Kissimmee, FL (US)

( * ) Notice: Subject to any disclaimer, the term of this patent is extended or adjusted under 35 U.S.C. 154(b) by 0 days.

(21) Appl. No.: 13/674,417

(22) Filed: Nov. 12, 2012

(65) Prior Publication Data

US 2013/0063231 A1 Mar. 14, 2013

Related U.S. Application Data

(63) Continuation-in-part of application No. 12/758,790, filed on Apr. 12, 2010, now Pat. No. 8,310,322.

(51) Int. Cl.
*H01H 9/20* (2006.01)
*H01H 50/00* (2006.01)
*H01F 7/124* (2006.01)
*H01H 50/32* (2006.01)
*G01R 31/02* (2006.01)

(52) U.S. Cl.
CPC ............... *H01F 7/124* (2013.01); *H01H 50/32* (2013.01); *G01R 31/024* (2013.01)
USPC .......................................... 335/127; 335/167

(58) Field of Classification Search
CPC .... H01H 50/32; H01H 19/6355; H01F 7/124; G01R 31/024
USPC ....................... 335/21, 22, 26, 176, 185, 186; 200/11 TC, 1 R, 17 R, 18, 50 C, 50 A, 200/323, 324, 327, 400
See application file for complete search history.

(56) References Cited

U.S. PATENT DOCUMENTS 6,693,248 B1 * 2/2004 Schultz ..................... 200/11 TC
7,541,555 B2 * 6/2009 Chang ........................... 200/524

* cited by examiner

*Primary Examiner* — Bernard Rojas
(74) *Attorney, Agent, or Firm* — The Miller Law Offices, PLC; Steven J. Miller, Esq.

(57) ABSTRACT

Traditional contactors utilize a magnetic circuit that requires its coil to be continuously powered up to hold contacts together. They are heavy and bulky with the type, quality and size of materials used to develop sufficient magnetic force to hold contacts together. They are inefficient, costly and are a safety concern due to potential overheating which could result into fire or damage to connected loads. The current invention utilizes a solenoid actuator assembly with locking and unlocking mechanism in place of the yoke and armature assembly used in traditional magnetic contactors. It does not require the coil to be continuously powered up during operation and the contactor could be manually, electronically or electrically controlled thereby avoiding unnecessary power loss. They are very efficient, safe to users and connected loads, and have long service life expectancy. They are also more cost-effective and smaller in size than traditional magnetic contactors.

26 Claims, 8 Drawing Sheets

EXPLODED VIEW OF SOLENOID ACTUATOR WITH AN INTEGRATED LOCKING & UNLOCKING MECHANISM

FLATTENED SURFACE VIEWS OF THE LOCKING & UNLOCKING MECHANISM STEMS OF THE SOLENOID ASSEMBLY

PART OF A CONTACTOR USING A SOLENOID ACTUATOR
WITH AN INTEGRATED LOCKING AND UNLOCKING MECHANISM

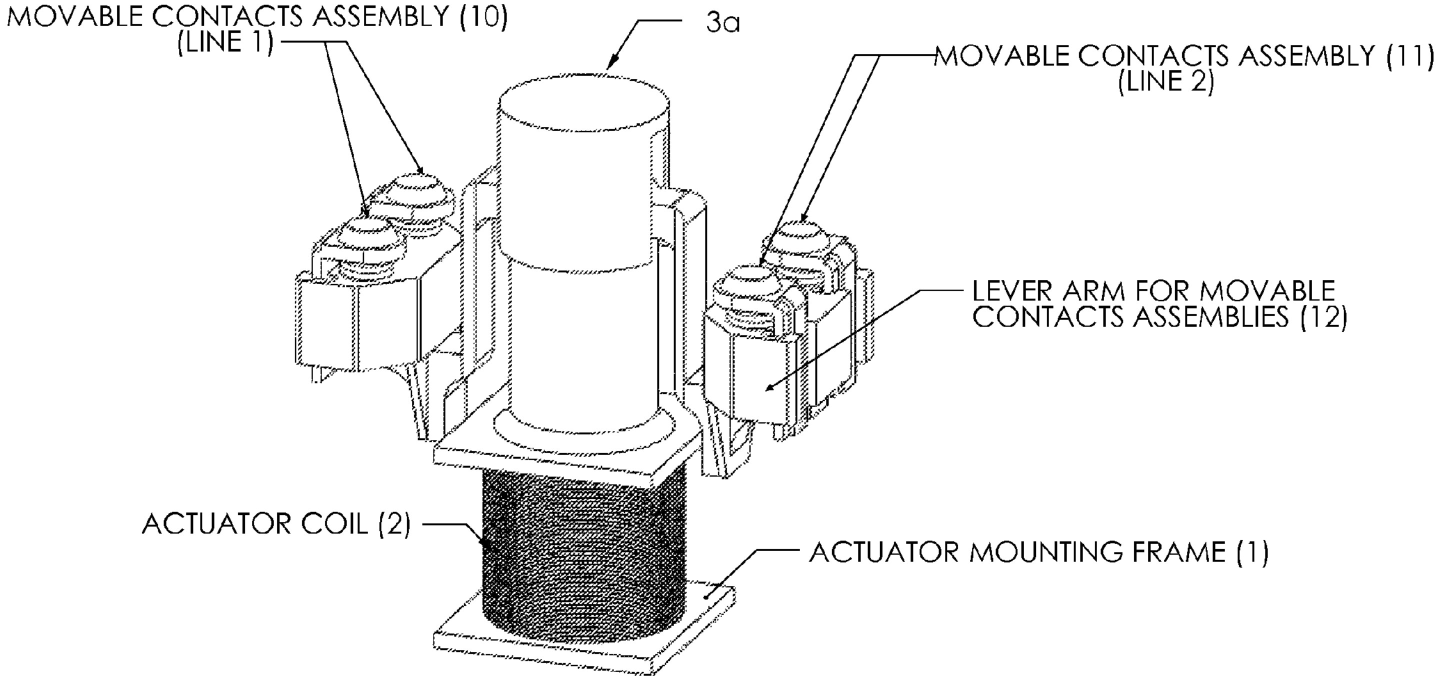

***NOTE:
THE STATIONARY CONTACTS OF THE ELECTROMAGNETIC CONTACTOR ARE POSITIONED OPPOSITE THE MOVABLE CONTACTS ASSEMBLY (10) & (11).
BOTH STATIONARY AND MOVABLE CONTACT ASSEMBLIES ARE CONFIGURED IN THE SAME WAY TO ESTABLISH STABLE CONTACT BETWEEN THEM WHEN THE ACTUATOR IS ACTIVATED. THE CONTACTS ARE DISENGAGED THE NEXT TIME THE ACTUATOR IS ACTIVATED. WIRING CONNECTIONS TO THE COILS ARE NOT SHOWN IN THE DRAWING

FIG. 4

PART OF A CONTACTOR USING A SOLENOID ACTUATOR WITH AN INTEGRATED MECHANICAL LOCKING AND UNLOCKING MECHANISM

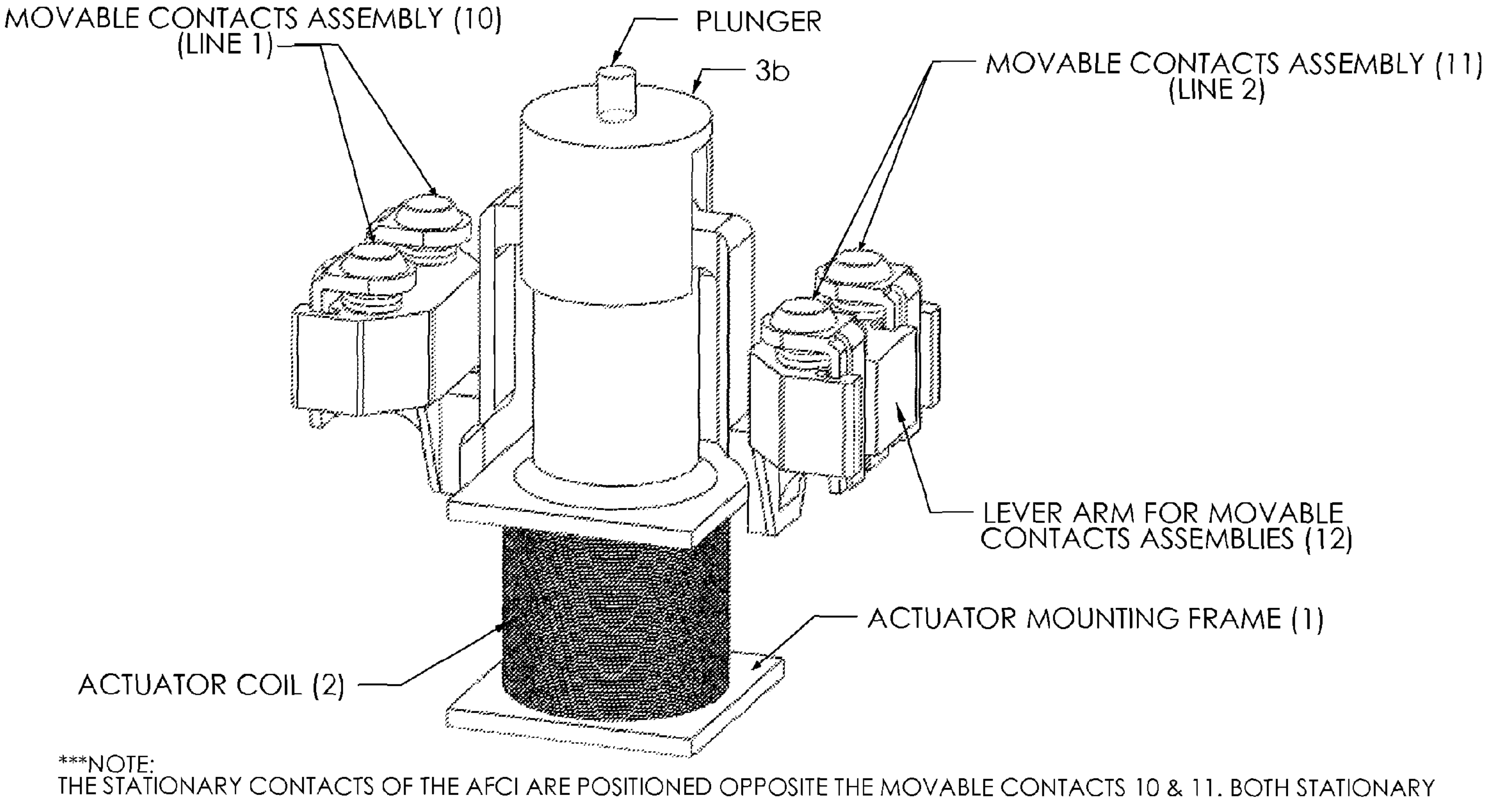

***NOTE:
THE STATIONARY CONTACTS OF THE AFCI ARE POSITIONED OPPOSITE THE MOVABLE CONTACTS 10 & 11. BOTH STATIONARY AND MOVABLE CONTACT ASSEMBLIES ARE CONFIGURED IN THE SAME WAY TO ESTABLISH STABLE CONTACT BETWEEN THEM WHEN THE RESET MECHANISM IS ACTIVATED OR ENGAGED. THE CONTACTS ARE DISENGAGED ON TEST CONDITION. WIRING CONNECTIONS TO THE COILS ARE NOT SHOWN IN THE DRAWING

FIG. 5

SOLENOID-ACTUATED CONTACTOR

CROSS-REFERENCE TO RELATED APPLICATIONS

This application is a Continuation-In-Part of U.S. patent application Ser. No. 12/758,790 filed on Apr. 12, 2010.

BACKGROUND OF THE INVENTION

The present invention involves an apparatus, system and method used in lieu of and/or in conjunction with traditional electromagnetically-operated control devices and equipment such as and including magnetic contactors, relays and circuit breakers. For exemplary purposes, the contactor will be used although the current invention could be used in many other applications. Existing electromagnetic contactors are typically used for among other purposes, to control the operation of electric motors, A/C or D/C and therefore are the main components for motor starters. Said electromagnetic contactors typically use an electromagnetic element which pulls or pushes the movable contacts towards the stationary contacts to establish electrical connection between the line and load terminals of the contactor. The electromagnetic element is typically a metallic core with a coil or winding to form a magnetic circuit which is activated when power is applied to the coil. Said magnetic circuit requires that power be continuously on to keep the magnetic contactor at "ON" position where the movable and stationary contacts are engaged. With the current invention, the electromagnetic element of the contactor is replaced by a solenoid actuator with an integrated locking and unlocking mechanism which do not require power to be continuously on to maintain the contactor contacts at "ON" position.

For purposes of this invention, the following terms are used and mean the same as or substitute for the other:

a) AC—in electrical terms, this refers to alternating current
b) DC—in electrical terms, this refers to direct current
c) LINE-SIDE—means that part of an electrical circuit, equipment or device which is intended for connection to the power supply.
d) LOAD-SIDE—means that part of an electrical circuit, equipment or device which is intended for connection to an electrical load.
e) OFF—term to indicate a contact or switch position being OFF, a button designation for OFF position, turn OFF or turned OFF, switch or switched OFF. This term also mean that the contactor movable and stationary contacts are disengaged.
f) ON—term to indicate a contact or switch position being ON, a button designation for "ON" position, turn ON or turned ON, power up or powered up. This term also mean that the contactor movable and stationary contacts are engaged.
g) SOLENOID-ACTUATED—also mean electromagnetically-actuated, pertains to the method of actuating the operating mechanism of an equipment, device or system.
h) SOLENOID—refers to an assembly consisting of among others, a coil or winding on a core to produce a uniform magnetic field and a plunger which is actuated by the magnetic field which in turn attaches to a movable fixture
i) CONTACTOR—refers to an electromagnetic contactor, magnetic contactor, or any other type of contactor which operates to establish electrical connection between two terminals

SUMMARY OF THE INVENTION

The present invention involves an apparatus, system and method used in lieu of and/or in conjunction with traditional electromagnetically-operated control devices and equipment such as and including relays, contactors and circuit breakers. The current invention replaces the magnetic elements of a traditional contactor with a solenoid actuator with an integrated locking and unlocking mechanism which do not require power to be continuously on to maintain the contactor at "ON" position. It also provides a means to operate the contactor manually, semi-automatically, or automatically, by electrical or electronic control circuits, thereby reducing power usage, increasing device efficiency, extending lifespan, improving safety levels of operation, and reducing cost, among other benefits.

BRIEF DESCRIPTION OF THE DRAWINGS

FIG. 4 details a part of a contactor using a solenoid actuator disclosed in Tomimbang Patent Application No. 12758790 filed on Apr. 12, 2010.

FIG. 5—same as FIG. 4 but with the plunger extended above the retainer cap to allow manual operation of the contactor.

DETAILED DESCRIPTION OF EMBODIMENTS

References will now be made in detail to describe the exemplary embodiments of the present invention, which are in part illustrated in the accompanying drawings. Details disclosed herein are not to be interpreted as limiting, but rather as basis for the claims and teaching one skilled in the art how the present invention could be employed in any appropriately detailed system, structure or manner. Wherever possible, the same reference numbers are used throughout the drawings to refer to the same or like components, or functions. Illustrations and references made are basic, illustrative and not to be interpreted as limiting, where an actual product incorporating the current invention may involve other components to satisfy specific design requirements but with the same principles and intents of the current invention. While the invention has been described with preferred embodiments, it is not intended to limit the scope of the invention to the particular form set forth, but on the contrary, it is intended to cover such alternatives, modifications, and equivalents as may be included within the spirit and scope of the invention as defined by the appended claims.

The present invention involves an apparatus, system and method used in lieu of and/or in conjunction with traditional electromagnetic-operated control devices and equipment such as and including relays, contactors, circuit breakers, electrical outlets for AFCI and GFCI, electrical plugs. For exemplary purposes, the magnetic contactor will be used, although the invention applies to many other devices, equipment or systems. Traditional electromagnetic contactors are typically used to control the operation of electric motors, A/C or D/C and is the main component for motor starters. Said electromagnetic contactors typically use an electromagnetic element which pulls or pushes the movable contacts towards the stationary contacts to establish connection between the line and load terminals of the contactor. The electromagnetic element of said contactors is typically a metallic core with a coil or winding to form a magnetic circuit which is activated when power is applied to the coil. Said magnetic circuit requires that power be continuously on to keep the traditional magnetic contactor at "ON" position. With the current invention, the electromagnetic element of the traditional magnetic contactor is replaced by a solenoid actuator with an integrated locking and unlocking mechanism.

Figure 1:
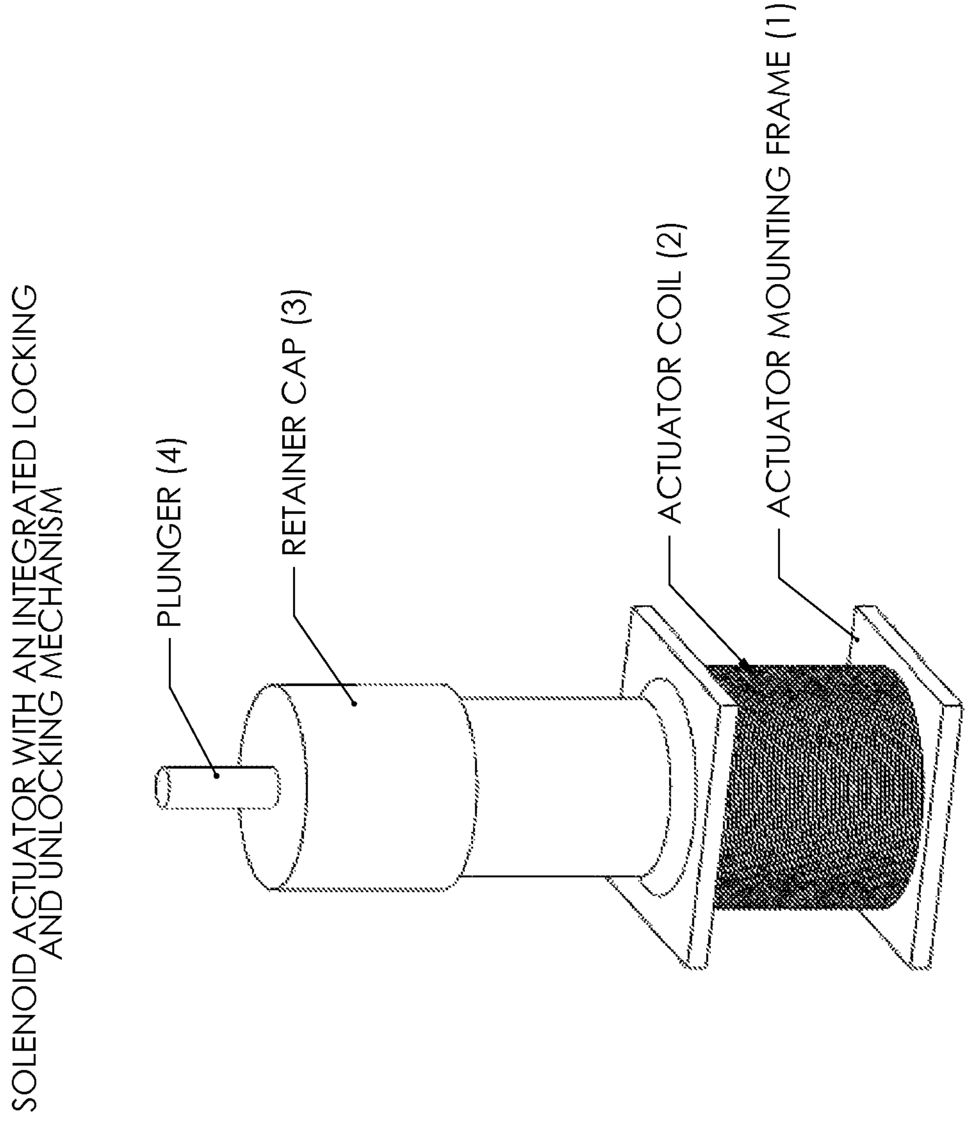
FIGS. 1 to 3 show details and elements of the solenoid actuator disclosed in Tomimbang Patent Application No. 12758790 filed on Apr. 12, 2010.
Figure 2:
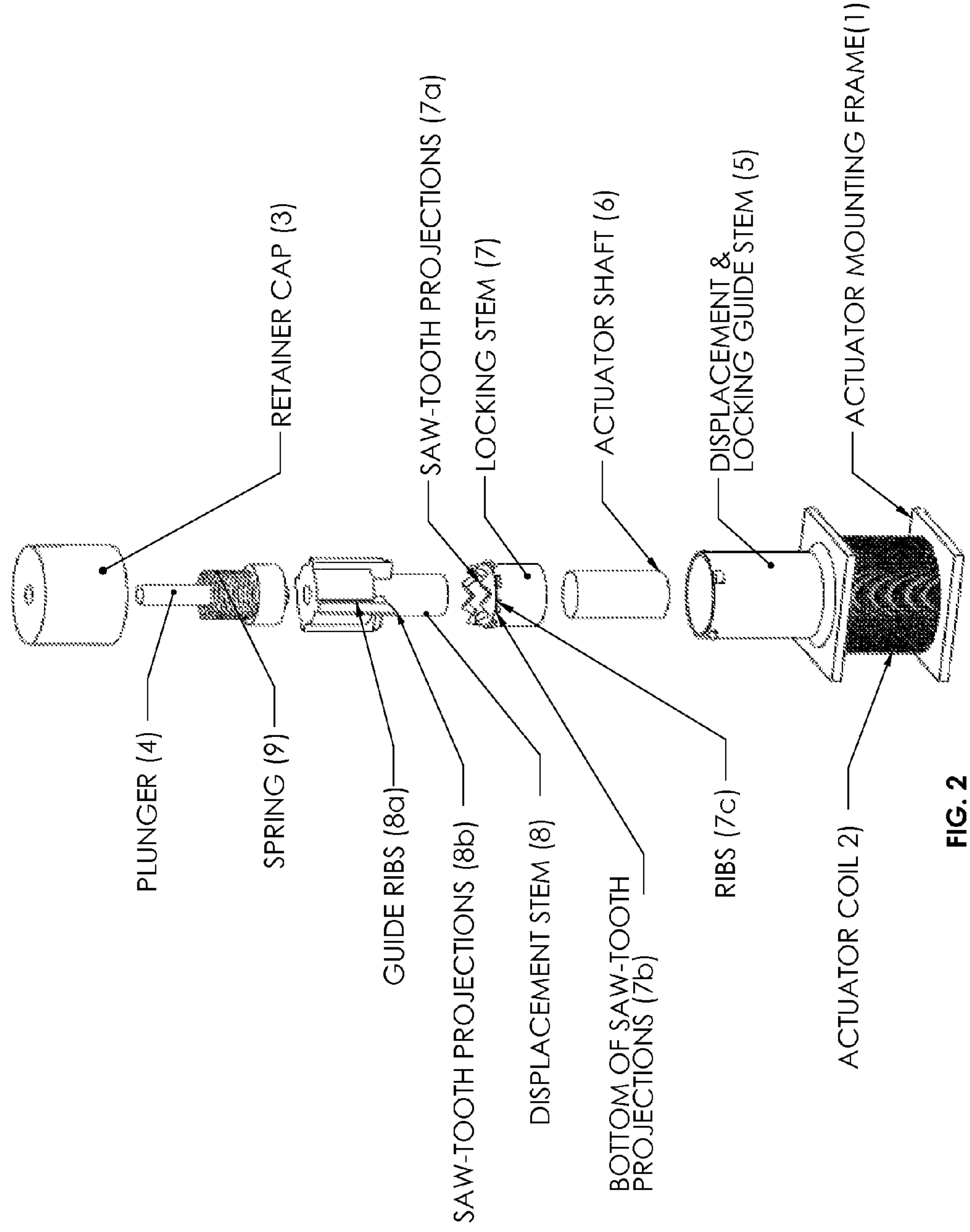
Figure 3:
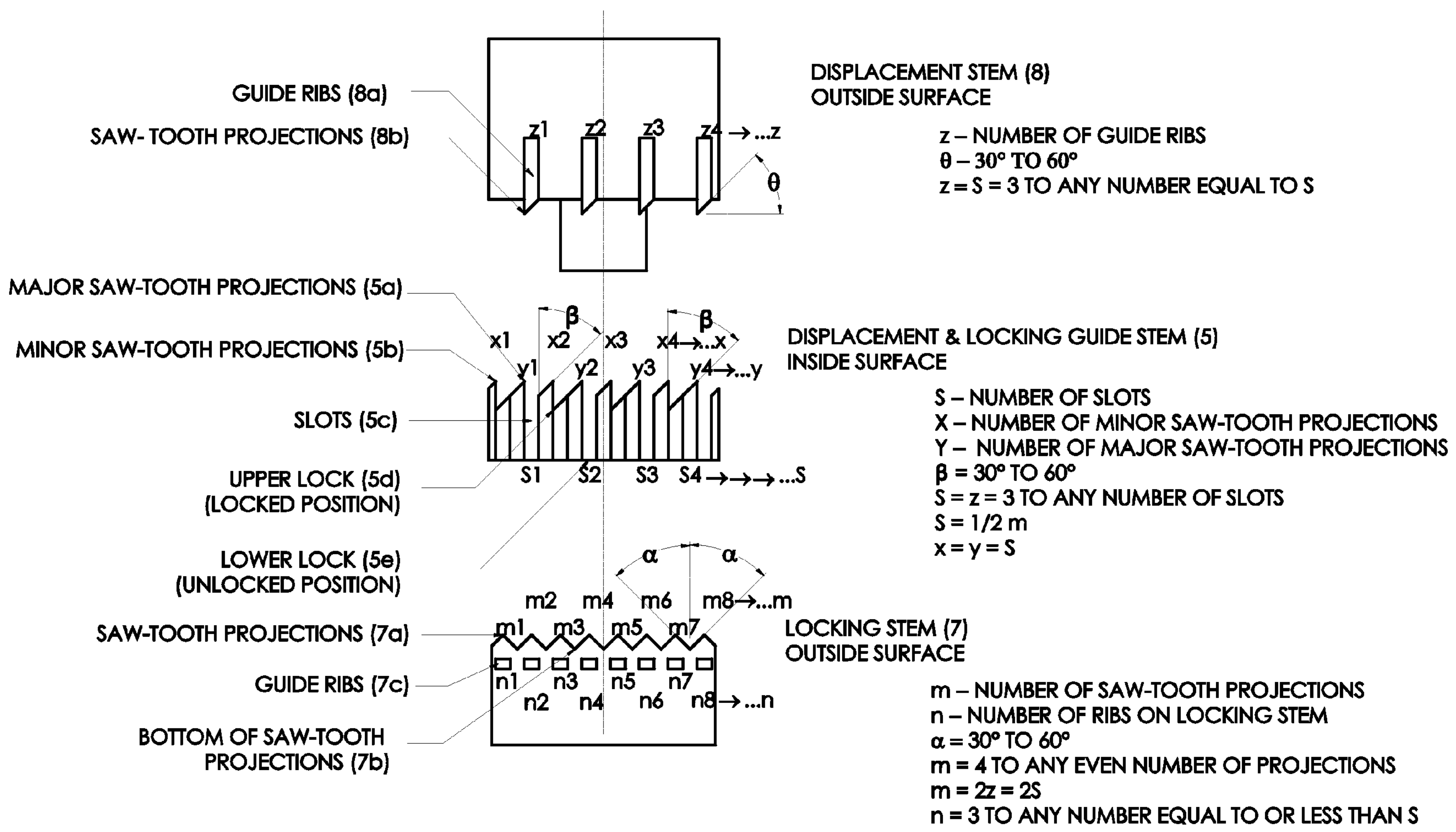

The current invention incorporates a solenoid actuator with an integrated locking and unlocking mechanism disclosed in Tomimbang Patent Application No. 12758790 filed on Apr. 12, 2010 into a contactor, relay, circuit breaker and any other control devices, equipment and systems. FIG. 1 shows the main elements of the said solenoid actuator 1, 2, 3, 4 and its basic internal components are shown in an exploded view in FIG. 2, is composed of an actuator frame 1, actuator coil 2, retainer cap 3, plunger 4, displacement and locking guide stem 5, actuator shaft 6, locking stem 7, saw-tooth projections 7*a*, bottom of saw-tooth projections 7*b*, ribs 7*c*, displacement stem 8, guide ribs 8*a*, saw-tooth projections 8*b*, and spring 9. The operation of said solenoid actuator is as disclosed in the Tomimbang patent application above, and FIG. 3 details the surface view of the locking and unlocking mechanism components essential for the retractable motion of the solenoid actuator assembly. The disclosed configuration of these components are basically for illustration purposes only and may be re-configured or other components may be added to satisfy specific technical requirements to suit the assembly to a particular application, within the same principles and objectives disclosed in this patent application.

Figure 6:
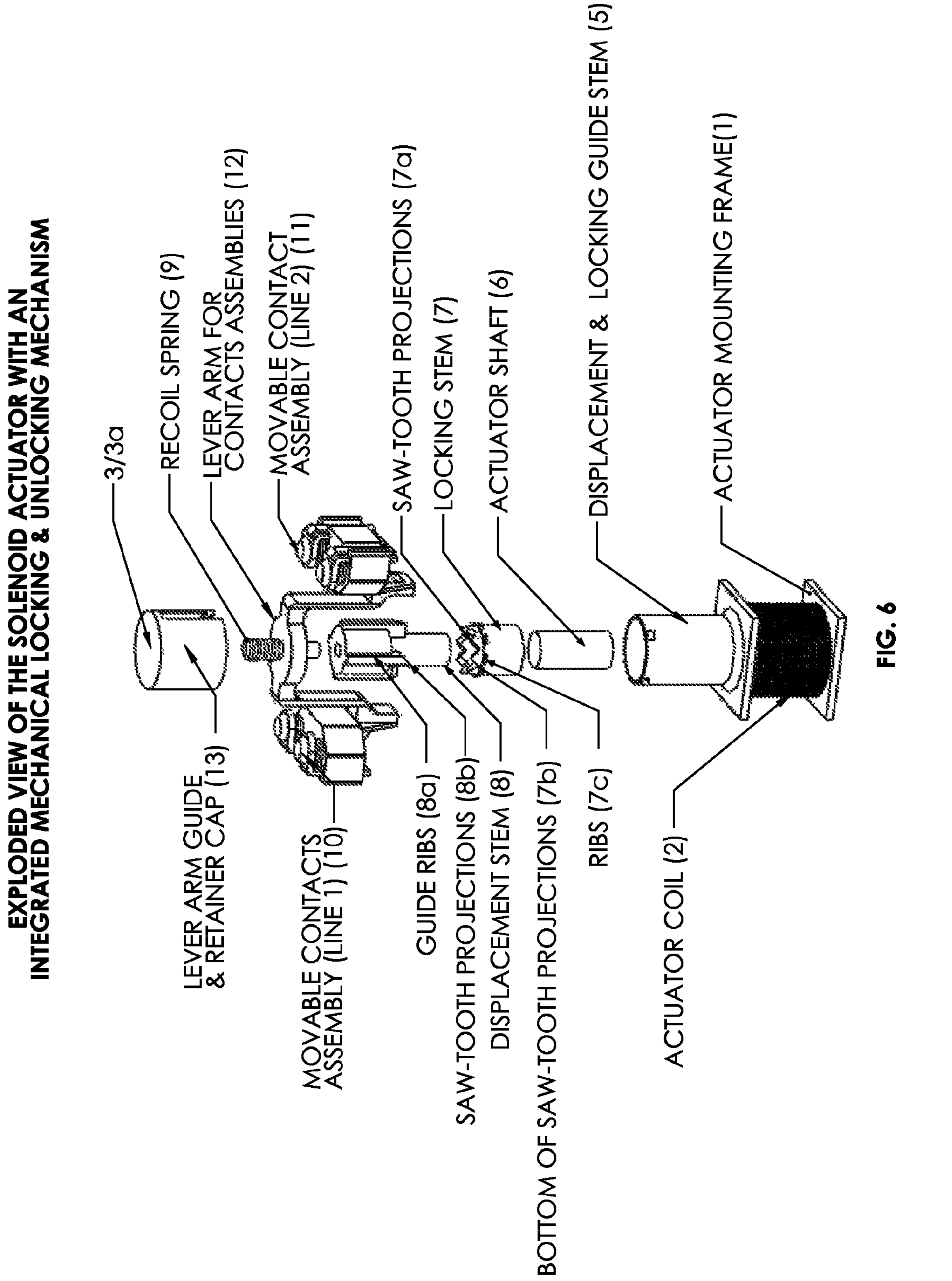
FIG. 6 shows an exploded view of the solenoid actuator disclosed in Tomimbang Patent Application No. 12758790 filed on Apr. 12, 2010.

FIGS. 4 to 6 provide details of a solenoid actuator assembly with an integrated locking and unlocking mechanism incorporating movable contact assemblies 10, 11. The two contact points shown with the movable contact assemblies 10, 11 could be electrically connected by a variety of means through among others, a metallic plate, or wire. A spring or alternative material may be used under the contact points or plates to serve as cushion and to establish a good electrical connection with the stationary contacts when the contactor is on. The contactor shown is for a 2-pole configuration but it could be configured using the same principle for use on any number of poles, i.e., 1-pole, 3-pole, etc. These figures show that the movable contact assemblies 10 and 11 are facing up, meaning that the stationary contacts, which are not shown, are facing down to have the movable and stationary contacts engage with each other when the contactor is turned on. Alternatively, the movable contacts assemblies 10, 11 may be configured facing down, meaning that the stationary contacts, which are not shown, are facing up to have the movable and stationary contacts engage with each other when the contactor is turned on. In either case, the lever arm for movable contacts assemblies 12 need to be properly configured to the actual design requirement. The solenoid actuator could be designed to operate in a pull or push direction according to the position of the movable contacts assemblies 10, 11 in relation with the stationary contacts assemblies, which are not shown. The stationary contacts assemblies are made and constructed of matching configuration to mate properly with the movable contacts assemblies 10, 11. The stationary and movable contact assemblies are oriented to move in the opposing directions to be able to engage when the contactor is turned on. The lever arm guide and retainer cap 3, 3*a*, 3*b*, 13 is made of such configuration to allow smooth movement of the lever arm for movable contacts assemblies 12, and may also be blanked at top or with an opening for movement of a plunger 4 as actual design requirement may call for. In lieu of said lever arm guide and retainer cap 3, 3*a*, 3*b* a recess on the stationary contacts assembly or frame made of matching configuration may be used to serve the same purposes. The plunger 4 may also be used to manually turn the contactor ON or OFF, with or without power to the coil 2.

Figure 7:
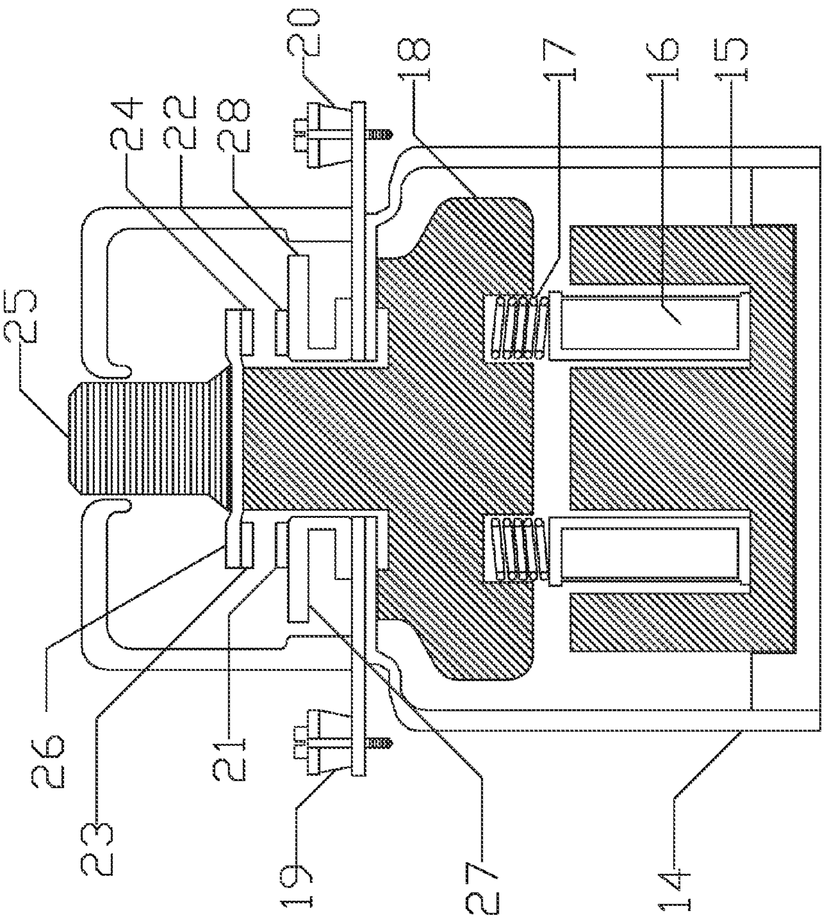
FIG. 7 PRIOR ART
FIG. 7—shows a section inside a traditional magnetic contactor with its basic components.

FIG. 7 shows a section inside a typical magnetic contactor with its basic components. The movable contacts 23, 24 are assembled into the armature 18 through the movable contacts assembly 26. When the coil 16 is powered up or the contactor is switched on, the yoke 15 is magnetized, pulling toward itself armature 18 and in the process, pulling the movable contacts assembly 26 toward the stationary contacts assemblies 27, 28, thereby making the movable and stationary contacts 22 and 24, 21 and 23 engaged with each other. The coil 16 needs to be continuously powered up to maintain the magnetic attachment between the yoke 15 and the armature 18, and the movable contacts 23, 24 and the stationary contacts 21, 22 remaining electrically connected. When power to the coil 16 is switched off or interrupted, the yoke 15 is demagnetized and the springs 17 push the armature 18 away from the yoke to separate them, thereby separating the stationary and movable contacts 21, 22, 23, 24 where at this point the contactor is turned off. While the movable contacts 23, 24 are configured facing down in FIG. 7 since the stationary contacts 21, 22 are facing up, the contactor could also be re-configured such that the movable contacts 23, 24 would be facing up, the stationary contacts 21, 22 facing down, and, the stationary contacts assemblies 27, 28 and the movable contacts assembly 26 accordingly need to be re-positioned to ensure proper engagement of contacts when contactor is turned on.

It is very common with traditional electromagnetic contactors that the yoke 15 and armature 18 build up heat over a certain period of usage that the magnetic force decreases which cause chattering as characterized by a hammering sound between the yoke 15 and armature 18. Chattering in effect causes an unstable electrical connection between the movable and stationary contacts 21, 22, 23, 24 that could result into arcs, and ultimately, burning of the contacts. This as well could ultimately affect the connected loads and other ancillary devices and may damage them. Since the coil 16 in a traditional magnetic contactor requires continuous power supply to maintain the magnetic attachment between the yoke 15 and the armature 18, this accounts to unnecessary power loss as well as decreased service lifespan for the contactor due to the continuous exposure of the contactor components or elements to the heat built up on the yoke 15, coil 16 and armature 18 during operation. The other standard contactor components shown in FIG. 7 include the housing 14, line and load side wiring terminals 19, 20, and contactor position indicator 25.

Figure 8:
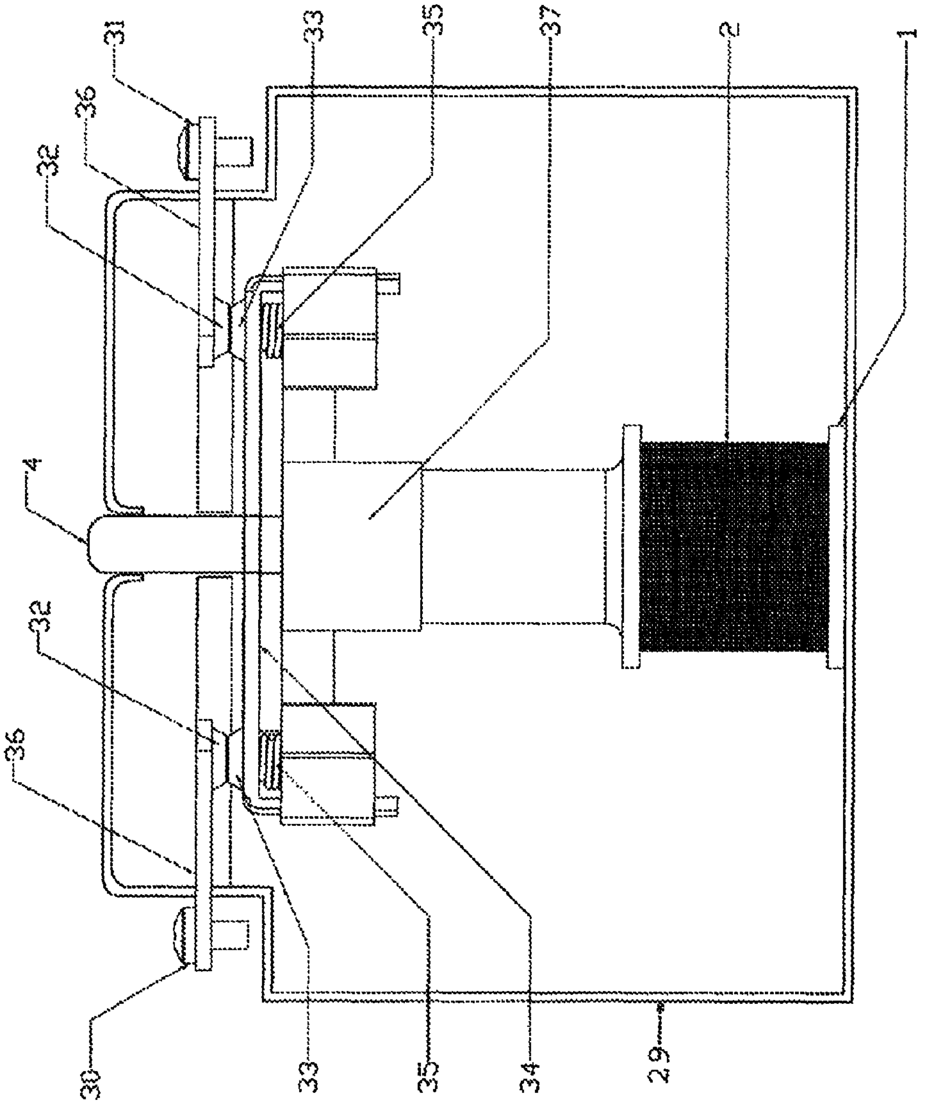
FIG. 8—shows a section inside the contactor of the current invention, incorporating a solenoid actuator with an integrated locking and unlocking mechanism.

FIG. 8 shows a section inside a contactor of the current invention, incorporating a solenoid actuator with an integrated locking and unlocking mechanism disclosed in the Tomimbang patent application above, with the basic elements of a traditional contactor. Although for purposes of disclosure not all components of an actual contactor are shown, the contactor in this invention comprises a housing 29, a solenoid actuator assembly with integrated locking and unlocking mechanism 37 as illustrated in FIGS. 1 to 6, movable contacts 33 and movable contacts assembly 34 with spring tensioners 35, stationary contacts 32 and stationary contact assemblies 36, line-side and load-side terminals 30, 31, a manual reset mechanism or plunger 4, and other standard contactor elements which though not shown include arc chutes or protectors, springs, test and reset buttons, auxiliary contacts, indicator lights, and visual indicators for contactor condition, among others.

The contactor in this invention could be built with any number of poles using the same principles disclosed herein and the coil 2 may be designed to operate in either AC or DC power supply.

With the current invention utilizing a solenoid actuator with an integrated locking and unlocking mechanism where the actuator shaft 6, which is also called a solenoid plunger, becomes the equivalent of the armature 18 in a traditional magnetic contactor, the space is minimized and therefore could reduce the overall size of a magnetic contactor. Traditional magnetic contactors could be very bulky due to the size of yoke 15 and armature 18 needed to develop the magnetic force to pull the armature 18 towards the yoke 15 to engage the movable and stationary contacts 21 and 23, 22 and 24 together and turn the contactor on.

The current invention utilizing a solenoid actuator with an integrated locking and unlocking mechanism requires only a pulse or momentary power supply to the coil 2 to turn the contactor on or off and remain in that position until the next time the coil is powered up through electronic control or by any other means.

The solenoid actuator with an integrated locking and unlocking mechanism used in the current invention could be manufactured as a sub-assembly, reducing cost in the manufacturing of contactors. As a sub-assembly, it could also be used as a mechanical switching element for other equipment, system and devices including circuit breakers, relays, door openers, alarm systems, among a number of applications.

While FIG. 8 details a configuration with a particular orientation of the movable contacts 33 with the stationary contacts 32, using the same principles, it could be configured a number of ways depending on the desired construction of the contactor.

The solenoid actuator with an integrated locking and unlocking mechanism may be configured to either push or pull type motion, depending on the design and orientation of the movable and stationary contacts 32, 33 and with the contactor housing.

The current invention utilizes a solenoid actuator with an integrated locking and unlocking mechanism with a retractable motion, which means that every time the coil 2 is powered up, it causes the assembly to go either on an extended or retracted position corresponding to the contactor's on or off positions, depending on how the movable and stationary contacts are configured. With this retractable mechanism, the plunger 28 could be used independently as a manual switch to turn the contactor on or off, without powering up the coil 2. The contact assemblies 34, 36 with matching fixtures, could be incorporated with accessories such as and including auxiliary contacts for control purposes and visual indicators such as for indication of position of the contactor contacts, whether on or off, among other features.

With the solenoid actuator with an integrated locking and unlocking mechanism, the current invention could be controlled manually, electrically and electronically or by any combinations thereof. Having a retractable locking and unlocking mechanism, offers a multitude of choices on how the contactor could be used for different applications as never before possible with the traditional magnetic contactors. A contact position indicator through auxiliary contacts which are either normally open (NO) or normally close (NC) may be incorporated into the contactor for better control and manageability, monitoring and other functions in an electrical or electronic control system.

With the solenoid actuator with an integrated locking and unlocking mechanism where the coil 2 is only momentarily powered up then powered off as a pulse-switched device, the contactor efficiency is increased and power consumption is minimized when compared with the traditional magnetic contactor which requires its coil 16 to be continuously powered up when the contactor is in operation.

With the solenoid actuator with an integrated locking and unlocking mechanism, the current invention could be designed to be much smaller in size than traditional magnetic contactors and provides better flexibility in its housing 29 design.

What is claimed is:

1. A contactor apparatus comprising:

a housing, a solenoid actuator assembly having a linear motion, single-coil solenoid actuator, capable of operation on either an Alternating Current or Direct Current power supply, said apparatus further comprising an integrated locking and unlocking mechanism, said solenoid actuated assembly having a single actuator coil mounted on its frame and having a displacement and locking guide stem, having an actuator shaft being the armature, having a locking stem, having a displacement stem, having a plunger, having a recoil spring, having a retainer cap, inside said displacement and locking guide stem, are slots and ribs that guide the movement of said displacement stem and said locking stem, the ribs of said displacement and locking guide stem have double saw-tooth shaped projections, where the major saw-tooth projections serve as the upper position lock, whereas the minor saw-tooth projections slope to the slots thereon, said saw-tooth shaped projections are sloped with the same angle but of opposite orientation in the assembly with the saw-tooth projections of the displacement stem, said locking stem thereon is equipped with ribs on the side that move along the slots on the displacement and locking guide stem to keep it firmly in position, the top of said locking stem having saw tooth projections that lock with saw-tooth projections of said displacement stem, whereby for every solenoid actuation, the wedging actions between the saw-tooth shaped projections of the stems cause the displacement stem to turn incrementally thereby positioning the saw-tooth projections to either the upper lock or on the slots where they rest on top of the guide ribs of the locking stem at the lower lock position, the upper and lower lock positions respectively corresponding to the plunger locked and unlocked positions, further having a recoil spring to push the plunger downward to cushion on both locked and unlocked position, as well as to support positioning and integrity of the assembly, and said mechanism mechanically latching, and thereby locking, the solenoid assembly at the end of the solenoid shaft's allowable travel with the single coil solenoid then being in the de-energized state at the end of the solenoid shaft's completed travel, said mechanism mechanically unlatching, and thereby unlocking, the solenoid assembly at the end of the solenoid shaft's allowable travel with the single coil solenoid then being in the de-energized state at the end of the solenoid shaft's completed travel, thereby eliminating the need of permanent magnets to hold said latching mechanism, and said apparatus operating as a self-latching and self-unlatching device by the solenoid actuator repeating the same linear motion, said apparatus' integrated locking and unlocking mechanism being completely mechanical in nature, without need of secondary actuator or external release fixture, movable contacts, movable contacts assemblies, stationary contacts, stationary contacts assemblies, line-side terminals, load-side terminals, a reset mechanism, a lever arm for said movable contacts assemblies, said lever arm having a lever arm guide, said movable contacts assemblies having at least two contacts, one of said contacts to connect the line-side terminals and one of said contacts to connect to the load-side terminals of said contactor apparatus, said stationary contacts assemblies having at least two contacts, one of said contacts to connect to the line-side terminals and one of said contacts to connect to the load-side terminals of contactor apparatus.

2. Said contactor apparatus of claim 1 wherein the said solenoid actuator assembly with integrated locking and unlocking mechanism replaces the yoke and armature used in traditional magnetic contactors to engage the movable and stationary contacts when the coil is powered up.

3. Said contactor apparatus of claim 1 in which the plunger in said solenoid actuator assembly with integrated locking and unlocking mechanism is used to manually switch the contactor on or off, independently from the coil operation, and whether power is on or off.

4. Said contactor apparatus of claim 1 wherein said solenoid actuator assembly with integrated locking and unlocking mechanism allows the contactor to be electrically or electronically switched on or off through an electrical or electronic control circuitry, locally located on the contactor housing itself, or remotely.

5. Said contactor apparatus of claim 1 wherein said solenoid assembly with integrated locking and unlocking mechanism is configured where the actuator is either a pull or push type, corresponding to the orientation of the movable and stationary contacts in relation with the contactor.

6. Said contactor apparatus of claim 1 wherein said solenoid actuator assembly with integrated locking and unlocking mechanism is configured where the actuator is a dual-motion or push-pull type, corresponding to the orientation of the movable and stationary contacts in relation with the contactor housing, and according to the control requirements of the load.

7. Said contactor apparatus of claim 1 is configurable to any number of poles.

8. Said contactor apparatus of claim 1 wherein said solenoid actuator assembly with integrated locking and unlocking mechanism has its coil operated by either A/C or D/C pulsed or momentary power supply and does not require power to be continuously energized in order to keep the contactor engaged.

9. Said contactor apparatus of claim 1 wherein said solenoid actuator assembly with integrated locking and unlocking mechanism is a sub-assembled component of the contactor.

10. Said contactor apparatus of claim 1 wherein said solenoid actuator assembly with integrated locking and unlocking mechanism is not a sub-assembly and components are assembled into the contactor.

11. Said contactor apparatus of claim 1 wherein said solenoid actuator assembly with integrated locking and unlocking mechanism operates in a retractable motion that alternately positions the plunger to an extended or retracted position corresponding to a contactor on or off position, when actuated manually or electrically.

12. Said solenoid actuator assembly with integrated locking and unlocking mechanism of claim 1 which is used separately as a switching element for other equipment, system and devices requiring the same nature of operation including relays, circuit breakers, electrical outlets for AFCI and GFCI, electrical plugs.

13. A system for design, construction and operation of a contactor, said system comprising:

a housing, a solenoid actuator assembly having a linear motion, single-coil solenoid actuator, capable of operation on either an Alternating Current or Direct Current power supply, said apparatus further comprising an integrated locking and unlocking mechanism, said solenoid actuated assembly having a single actuator coil mounted on its frame and having a displacement and locking guide stem, having an actuator shaft being the armature, having a locking stem, having a displacement stem, having a plunger, having a recoil spring, having a retainer cap, inside said displacement and locking guide stem, are slots and ribs that guide the movement of said displacement stem and said locking stem, the ribs of said displacement and locking guide stem have double saw-tooth shaped projections, where the major saw-tooth projections serve as the upper position lock, whereas the minor saw-tooth projections slope to the slots thereon, said saw-tooth shaped projections are sloped with the same angle but of opposite orientation in the assembly with the saw-tooth projections of the displacement stem, said locking stem thereon is equipped with ribs on the side that move along the slots on the displacement and locking guide stem to keep it firmly in position, the top of said locking stem having saw tooth projections that lock with saw-tooth projections of said displacement stem, whereby for every solenoid actuation, the wedging actions between the saw-tooth shaped projections of the stems cause the displacement stem to turn incrementally thereby positioning the saw-tooth projections to either the upper lock or on the slots where they rest on top of the guide ribs of the locking stem at the lower lock position, the upper and lower lock positions respectively corresponding to the plunger locked and unlocked positions, further having a recoil spring to push the plunger downward to cushion on both locked and unlocked position, as well as to support positioning and integrity of the assembly, and said mechanism mechanically latching, and thereby locking, the solenoid assembly at the end of the solenoid shaft's allowable travel with the single coil solenoid then being in the de-energized state at the end of the solenoid shaft's completed travel, said mechanism mechanically unlatching, and thereby unlocking, the solenoid assembly at the end of the solenoid shaft's allowable travel with the single coil solenoid then being in the de-energized state at the end of the solenoid shaft's completed travel, thereby eliminating the need of permanent magnets to hold said latching mechanism, and said apparatus operating as a self-latching and self-unlatching device by the solenoid actuator repeating the same linear motion, said apparatus' integrated locking and unlocking mechanism being completely mechanical in nature, without need of secondary actuator or external release fixture, movable contacts, movable contacts assemblies, stationary contacts, stationary contacts assemblies, line-side terminals, load-side terminals, a reset mechanism, a lever arm for said movable contacts assemblies, said lever arm having a lever arm guide, said movable contacts assemblies having at least two contacts one of said contacts to connect the line-side terminals and one of said contacts to connect to the load-side terminals of said contactor system, said stationary contacts assemblies having at least two contacts, one of said contacts to connect to the line-side terminals and one of said contacts to connect to the load-side terminals of the contactor system.

14. Said system of claim 13 for construction and operation of a contactor wherein said solenoid actuator assembly with integrated locking and unlocking mechanism replaces the yoke and armature used in traditional magnetic contactors to engage the movable and stationary contacts when the coil is powered up.

15. Said system of claim 13 for construction and operation of a contactor in which the plunger in said solenoid actuator assembly with integrated locking and unlocking mechanism is used to manually switch the contactor on or off, independently from the coil operation, and whether power is on or off.

16. Said system of claim 13 for construction and operation of a contactor wherein said solenoid actuator assembly with integrated locking and unlocking mechanism allows the contactor to be electrically or electronically switched on or off through an electrical or electronic control circuitry, locally located on the contactor housing itself, or remotely.

17. Said system of claim 13 for construction and operation of a contactor wherein said solenoid actuator assembly with integrated locking and unlocking mechanism is configured where the actuator is either a pull or push type, corresponding to the orientation of the movable and stationary contacts in relation with the contactor.

18. Said system of claim 13 for construction and operation of a contactor wherein said solenoid actuator assembly with integrated locking and unlocking mechanism is configured where the actuator is a dual-motion or push-pull type, corresponding to the orientation of the movable and stationary contacts in relation with the contactor housing, and according to the control requirements of the load.

19. Said system of claim 13 for construction and operation of a contactor wherein said solenoid actuator assembly with integrated locking and unlocking mechanism is configurable to any number of poles.

20. Said system of claim 13 for construction and operation of a contactor wherein said solenoid actuator assembly with integrated locking and unlocking mechanism has its coil operated by either A/C or D/C pulsed or momentary power supply and does not require power to be continuously energized in order to keep the contactor engaged.

21. Said system of claim 13 for construction and operation of a contactor wherein said solenoid actuator assembly with integrated locking and unlocking mechanism is a sub-assembled component of the contactor.

22. Said system of claim 13 for construction and operation of a contactor wherein said solenoid actuator assembly with integrated locking and unlocking mechanism is not a sub-assembly and components are assembled into the contactor.

23. Said system of claim 13 for construction and operation of a contactor wherein said solenoid actuator assembly with integrated locking and unlocking mechanism operates in a retractable motion that alternately positions the plunger to an extended or retracted position corresponding to a contactor on or off position, when actuated manually or electrically.

24. Said system of claim 13 for construction and operation of a contactor wherein said solenoid actuator assembly with integrated locking and unlocking mechanism is used separately as a switching element for other equipment, system and devices requiring the same nature of operation as circuit breakers, electrical outlets for AFCI and GFCI, electrical plugs.

25. A method for design, construction and operation of a contactor, said method comprising:

having a housing, having an electrically actuated solenoid actuated assembly, said assembly having a linear motion, single-coil solenoid actuator, being capable of operation on either an Alternating Current or Direct Current power supply, said solenoid actuated assembly having a single actuator coil mounted on its frame and having a displacement and locking guide stem, having an actuator shaft being the armature, having a locking stem, having a displacement stem, having a plunger, having a recoil spring, having a retainer cap, inside said displacement and locking guide stem, are slots and ribs that guide the movement of said displacement stem and said locking stem, the ribs of said displacement and locking guide stem have double saw-tooth shaped projections, where the major saw-tooth projections serve as the upper position lock, whereas the minor saw-tooth projections slope to the slots thereon, said saw-tooth shaped projections are sloped with the same angle but of opposite orientation in the assembly with the saw-tooth projections of the displacement stem, said locking stem thereon is equipped with ribs on the side that move along the slots on the displacement and locking guide stem to keep it firmly in position, the top of said locking stem having saw tooth projections that lock with saw-tooth projections of said displacement stem, whereby for every solenoid actuation, the wedging actions between the saw-tooth tooth shaped projections of the stems cause the displacement stem to turn incrementally thereby positioning the saw-tooth projections to either the upper lock or on the slots where they rest on top of the guide ribs of the locking stem at the lower lock position, the upper and lower lock positions respectively corresponding to the plunger locked and unlocked positions, further having a recoil spring to push the plunger downward to cushion on both locked and unlocked positions, as well as to support positioning and integrity of the assembly, and said mechanism mechanically latching, and thereby locking, the solenoid assembly at the end of the solenoid shaft's allowable travel with the single coil solenoid then being in the de-energized state at the end of the solenoid shaft's completed travel, said mechanism mechanically unlatching, and thereby unlocking, the solenoid assembly at the end of the solenoid shaft's allowable travel with the single coil solenoid then being in the de-energized state at the end of the solenoid shaft's completed travel, said assembly further having an integrated locking and unlocking mechanism thereby eliminating the need of permanent magnets to hold latches, and said assembly operating as a self-latching and self-unlatching device by the actuator repeating the same linear motion, said assembly's integrated locking and unlocking mechanism being completely mechanical in nature, without need of secondary actuator or external release fixture, movable contacts, movable contacts assemblies, stationary contacts, stationary contacts assemblies, line-side terminals, load-side terminals, a reset mechanism, a lever arm for said movable contacts assemblies, said lever arm having a lever arm guide, said movable contacts assemblies having at least two contacts one of said contacts to connect the line-side terminals and one of said contacts to connect to the load-side terminals of said contactor, said stationary contacts assemblies having at least two contacts, one of said contacts to connect to the line-side terminals and one of said contacts to connect to the load-side terminals of the contactor apparatus.

26. Said method of claim 25 for the design, construction and operation of a contactor further comprising:

having said contactor apparatus wherein said solenoid actuator assembly with integrated locking and unlocking mechanism replacing the yoke and armature used in traditional magnetic contactors to engage the movable and stationary contacts when the coil is powered up, said contactor apparatus having a plunger in said solenoid actuator assembly with integrated locking and unlocking mechanism and is used to manually switch the contactor on or off, independently from the coil operation, and whether power is on or off, said contactor apparatus having said solenoid actuator assembly with integrated locking and unlocking mechanism allows the contactor to be electrically or electronically switched on or off through an electrical or electronic control circuitry, locally located on the contactor housing itself, or remotely, said contactor apparatus having said solenoid actuator assembly with integrated locking and unlocking mechanism and is configured where the actuator is either a pull or push type, corresponding to the orientation of the movable and stationary contacts in relation with the contactor, said contactor apparatus having said solenoid actuator assembly with integrated locking and unlocking mechanism is configured where the actuator is a dual-motion or push-pull type, corresponding to the orientation of the movable and stationary contacts in relation with the contactor housing, and according to the control requirements of the load, said contactor apparatus being configurable to any number of poles, said contactor apparatus having said solenoid actuator assembly with integrated locking and unlocking mechanism and its coil operated by either A/C or D/C pulsed or momentary power supply and does not require power to be continuously energized to keep the contactor engaged, said contactor apparatus having said solenoid actuator assembly with integrated locking and unlocking mechanism being a sub-assembled component of the contactor, said contactor apparatus having said solenoid actuator assembly with integrated locking and unlocking mechanism being is not a sub-assembly and components that are assembled into the contactor, said contactor apparatus having said solenoid actuator assembly with integrated locking and unlocking mechanism operating in a retractable motion that alternately positions the plunger to an extended or retracted position corresponding to a contactor on or off position, when actuated manually or electrically, said solenoid actuator assembly with integrated locking and unlocking mechanism being used separately as a switching element for other equipment, system and devices requiring the same nature of operation as circuit breakers, electrical outlets for AFCI and GFCI, and electrical plugs.

* * * * *